United States Patent [19]

Shiomi

[11] Patent Number: 4,996,718
[45] Date of Patent: Feb. 26, 1991

[54] FREQUENCY CONVERTER CIRCUIT
[75] Inventor: Yasufumi Shiomi, Suita, Japan
[73] Assignee: Matsushita Electric Industrial Co., Ltd., Osaka, Japan
[21] Appl. No.: 309,730
[22] PCT Filed: Jun. 1, 1988
[86] PCT No.: PCT/JP88/00535
    § 371 Date: Jan. 30, 1989
    § 102(e) Date: Jan. 30, 1989
[87] PCT Pub. No.: WO88/10024
    PCT Pub. Date: Dec. 15, 1988
[30] Foreign Application Priority Data
    Jun. 2, 1987 [JP] Japan ................. 62-138525
[51] Int. Cl.$^5$ ............................................. H04B 1/26
[52] U.S. Cl. ............................ 455/323; 455/326; 455/327; 363/157
[58] Field of Search ............. 455/323, 326, 327, 330; 363/157

[56] References Cited
U.S. PATENT DOCUMENTS

| 3,562,651 | 2/1971 | Hoover et al. | 455/326 |
| 4,383,334 | 5/1983 | Epsom | 455/323 |
| 4,406,020 | 9/1983 | Reindel | 455/327 |
| 4,414,686 | 11/1983 | Lenz | 455/323 |
| 4,492,960 | 1/1985 | Hislop | 455/323 |
| 4,593,411 | 6/1986 | Schiller | 455/330 |
| 4,648,129 | 3/1987 | Hirai | 455/323 |
| 4,677,692 | 6/1987 | Sakashita | 455/323 |

FOREIGN PATENT DOCUMENTS 61-01133 5/1986 Japan.

OTHER PUBLICATIONS

13th International TV Symposium, 28th May–2nd Jun. 1983, Montreux, pp. 252–255, J. G. Chaplin et al., "European Satellite Broadcasting the Case for an FM Television Receiver".

Primary Examiner—Joseph A. Orsino
Assistant Examiner—Kinfe-Michael Negash
Attorney, Agent, or Firm—Stevens, Davis, Miller & Mosher

[57] ABSTRACT

The present invention relates to a frequency converter circuit which can be used in a receiving apparatus for receiving a satellite broadcast and which is designed so that a local oscillation signal is distributed and supplied from a single local oscillator to mixer circuits of electric signal processing circuits of more than two systems and mixer diodes of the mixer circuits are biased with a dc current thereby always applying a biasing with the dc current even to the mixer diode of the electric signal processing circuit of the system which is not operated, and there are advantages of ensuring a stable operation, making possible a reduction in the size and weight and making favorable from the cost point of view.

6 Claims, 2 Drawing Sheets

FREQUENCY CONVERTER CIRCUIT

TECHNICAL FIELD

The present invention relates to a frequency converter circuit which is used in a satellite broadcast receiving apparatus or the like so as to convert the high frequency signals of 12 GHz or 4 GHz band to the intermediate frequency signals of 1 GHz band.

BACKGROUND ART

In the satellite broadcasting, there are instances where signals of two or more different polarizations (the linear and circular polarization with the linear polarizations being divided into vertical and horizontal polarizations and the circular polarizations being divided right-hand and left-hand circular polarizations) are sent from the same direction to a particular area. Therefore, it is desirable that in this area such signals of plurality of different polarizations can be received altogether.

In frequency converter circuits of receiving apparatus for receiving such satellite broadcast, those heretofore put in practice have been constructed as shown in FIG. 1. In other words, an OMT (Ortho-Mode Transducer) 3 is connected to an input waveguide portion 2 within a circuit proper 1. Connected to the OMT 3 are an A-system electric signal processing circuit 4 including a mixer circuit 11a and a B-system electric signal processing circuit 5 including a mixer circuit 11b. An A-system local oscillator 8a is connected to the mixer circuit 11a of the A-system electric processing circuit 4 and also a B-system local oscillator 8b is connected to the mixer circuit 11b of the V-system electric signal processing circuit 5. In this case, the oscillation frequencies of the A-system local oscillator 8a and the B-system local oscillator 8b are of the same frequency. Also, it is constructed so that the supply of power to the A-system electric signal processing circuit 4 and the A-system local oscillator 8a and the supply of power to the B-system electric signal processing circuit 5 and the B-system local oscillator 8b are provided externally of the converters respectively from an A-system output connector 6 and a B-system output connector 7 through their respective power supply circuits or an A-system power supply circuit 9a and a B-system power supply circuit 9b, respectively. As a result, in order to operate only one of the two systems, only one of the output connectors is supplied with power, whereas in order to operate the two systems simultaneously, the power is supplied through the output connectors of the two systems.

It is to be noted that in FIG. 1 numerals 10a and 10b designate high frequency (RF) amplifier circuits, and 12a and 12b intermediate frequency (IF) amplifier circuits.

Such conventional device is of the construction which incorporates the two converters in the circuit proper 1 and it must be said that it is irrational from the cost point of view to dispose within the same circuit proper as many as two local oscillators which operate at the oscillation frequency. Also, it is needless to say that although the two oscillators oscillate at the same frequency, it is difficult to make the oscillation frequencies exactly the same and the mutual interference and disturbance of the two kinds of oscillation outputs tend to present problems.

DISCLOSURE OF INVENTION

It is an object of the present invention to provide a frequency converter circuit capable of operating a plurality of systems of electric signal processing circuits each including a mixer circuit with a single local oscillator.

To accomplish the above object, the present invention is constructed so that a single local oscillator is provided within a converter, that a part of a power supply circuit is used in common such that the supply of power to the local oscillator is provided from an output connector of any of a plurality of systems, and that a biasing with a dc current is applied to a mixer diode of a mixer circuit in each of electric signal processing circuits to which the oscillation output signal of the local oscillator is supplied, and also a biasing power supply circuit is used in common such that the biasing is always applied during the operation of the electric signal processing circuit of either one of the systems.

By virtue of this construction, the power supply circuit of the local oscillator is in common with the result that the local oscillator comes into operation by simply supplying power to the output connector of the electric signal processing circuit of the system to be operated thereby supplying an oscillation output signal to the mixer circuits of the electric signal processing circuits of all the systems, and the oscillation output signal is distributed and supplied to the respective mixer circuits due to the local oscillator being singular. In other words, the oscillation power supplied to each of the mixer circuits is decreased by an amount corresponding to the distribution as compared with the power in a case where there is provided a local oscillator for each mixer circuit.

As a result, it is constructed so that in the electric signal processing circuit of each system, the mixer diode is biased with a dc current so as to operate the mixer circuit with a low local oscillation power.

In addition, this biasing is always applied during the operation of the electric signal processing circuit of either of the systems, with the result that no variation is caused in the impedance when looking the mixer circuit side from the local oscillator (the load impedance of the local oscillator) and thus the oscillation frequency and oscillation power of the local oscillator are not varied.

As a result, even if the electric signal processing circuit of either of the systems is operated or even if the electric signal processing circuits of all the systems are operated simultaneously, the oscillation frequency and the oscillation power are not varied thus making the electric signal processing circuits of the plurality of systems operable by the single oscillator. Note that it is of course so constructed that the power is supplied only to the mixer diode of the mixer circuit in the electric signal processing circuit of that system which is not to be operated.

BEST MODE FOR CARRYING OUT THE INVENTION

Figure 1:
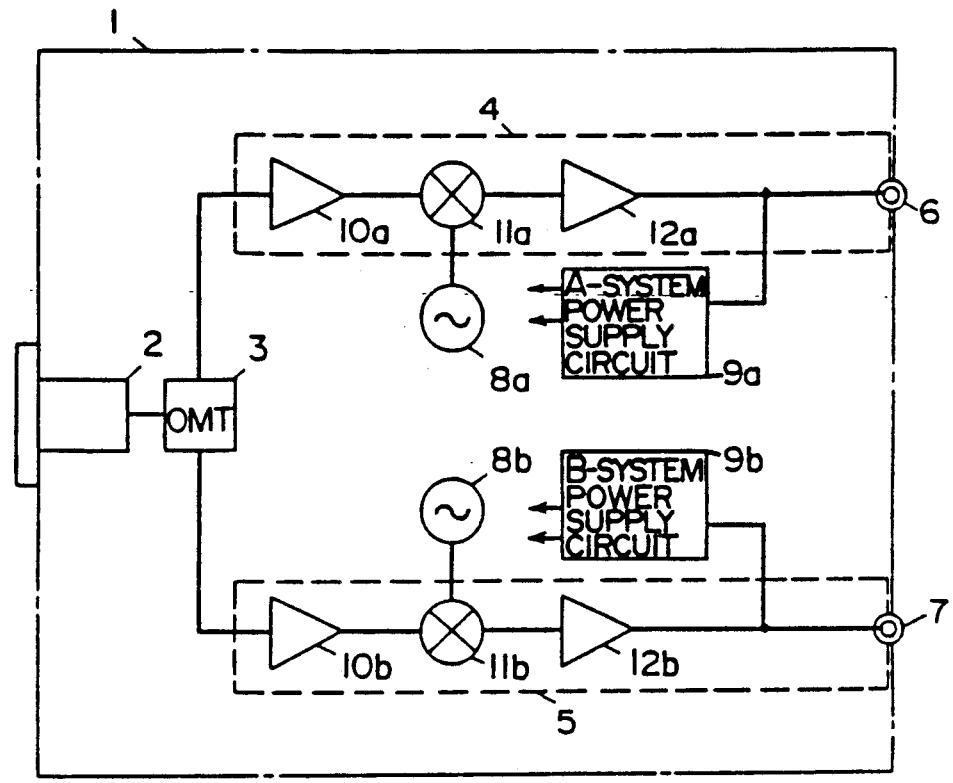
FIG. 1 is a block diagram of a conventional frequency converter circuit.
Figure 2:
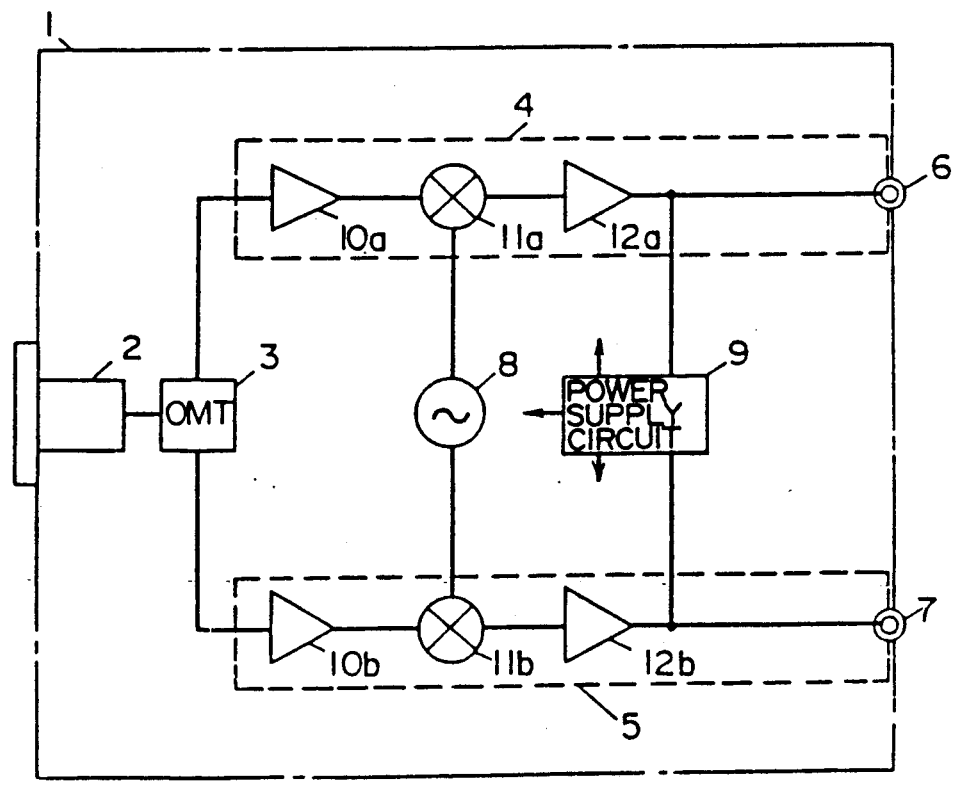
FIG. 2 is a block diagram of a frequency converter circuit according to an embodiment the present invention.

An embodiment of the invention will now be described with reference to FIGS. 2, 3 and 4 of the accompanying drawings. FIG. 2 is a block diagram of the frequency converter circuit of the invention. The embodiment shows a case where two systems of electric signal processing circuits or an A-system electric signal processing circuit 4 and a B-system electric signal processing circuit 5 are incorporated in a circuit proper 1.

In FIG. 2, connected to an input waveguide portion 2 is an OMT 3 for separating a vertically polarized signal and a horizontally polarized signal. Connected respectively to the two outputs of the OMI 3 are the A-system electric signal processing circuit 4 and the B system electric signal processing circuit 5 respectively including mixer circuits 11a and 11b and output connectors 6 and 7, and each of the mixer circuits 11a and 11b is so constructed that its mixer diode is biased with a dc current.

Figure 4:
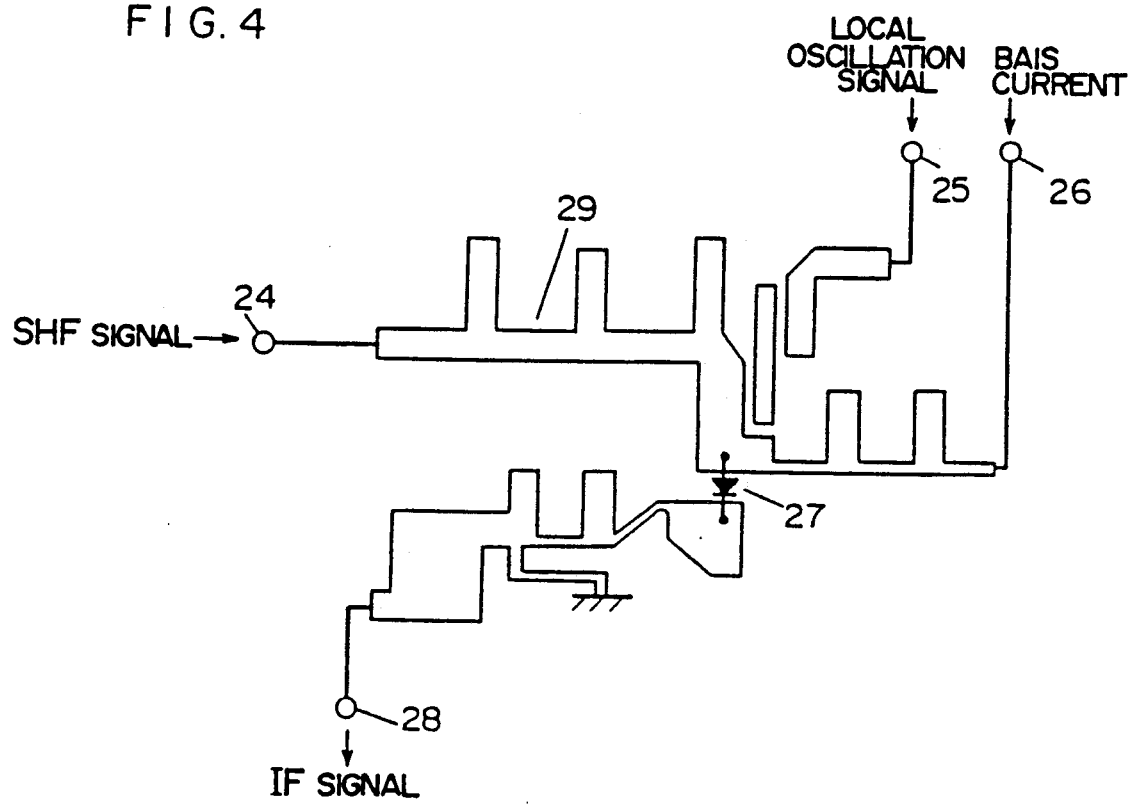
FIG. 4 is a detailed circuit diagram of the mixer circuit.

A description will now be made of FIG. 4 showing the mixer circuit. Numeral 24 designates an SHF signal input terminal, 25 a local oscillation signal input terminal, 26 a bias circuit connecting terminal for a mixer diode 27, 28 an intermediate frequency (IF) signal output terminal, and 29 a mixer circuit pattern, and the circuit is a well known circuit.

This frequency converter circuit further includes a single local oscillator 8 which includes a circuit for distributing the local oscillation signal and it includes a two-way splitter circuit in this embodiment. The thus distributed output portions of the local oscillator are respectively connected to the mixer circuits 11a and 11b of the respective systems. It is to be noted that the A-system output connector 6 and the B-system output connectors are terminals to which the indoor units of satellite broadcast receiving apparatus are respectively connected through cables.

Next, a power supply circuit 9 of the frequency converter circuit will be described with reference to FIG. 3. A terminal 13a is connected to the A-system output connector 6 through a high-frequency choke circuit and a terminal 13b is connected to the B-system output connector 7 through a high-frequency choke circuit. In addition, connected to the terminal 13a is an A-system electric signal processing circuit power supply circuit 16a excluding the biasing to the A-system mixer diode and connected to the terminal 13b is a B-system electric signal processing circuit power supply circuit 16b excluding the biasing to the B-system mixer diode. Also, the terminals 13a and 13b are respectively connected through a resistor 14a and a diode 15a and a resistor 14b and a diode 15b and through a voltage regulating circuit 17 to a mixer diode biasing power supply circuit 18 which is a common circuit for the two systems and a local oscillator power supply circuit 21. Here, the resistors 14a and 14b are balancing resistors and the diodes 15a and 15b are diodes for preventing the current from flowing backward. Also, the voltage regulating circuit 17 is a regulator for stabilizing the voltage of a dc power supplied from the terminal 13a or 13b so that after the voltage has been stabilized, the power is supplied to the mixer diode biasing power supply circuit 18 and the local oscillator power supply circuit 21.

The mixer diode biasing power supply circuit 18 has its terminal 20a connected to the mixer diode of the A system and its terminal 20b connected to the mixer diode of the B system. Note that each of resistors 19a and 19b is a resistor for determining the current flowing to the mixer diode. The local oscillator power supply circuit 21 has its terminal 23 connected to the local oscillator 8. Also, the A-system electric signal processing circuit power supply circuit 16a has its terminals 22a connected to the A-system electric signal processing circuit 4 excluding the mixer diode of the A-system, and the B-system electric signal processing circuit power supply circuit 16b has its terminals 22b connected to the B-system electric signal processing circuit 5 excluding the mixer diode of the B-system. Each of the power supply circuits 16a and 16b has a voltage regulating function.

With this construction, the operation of the embodiment will now be explained.

A description will be first made of a case in which only the A-system is operated and the B-system is not operated.

Where only the A-system is to be operated, power is supplied from the indoor unit to only the A-system output connector 6 through the cable and no power is supplied to the B-system output connector 7.

Figure 3:
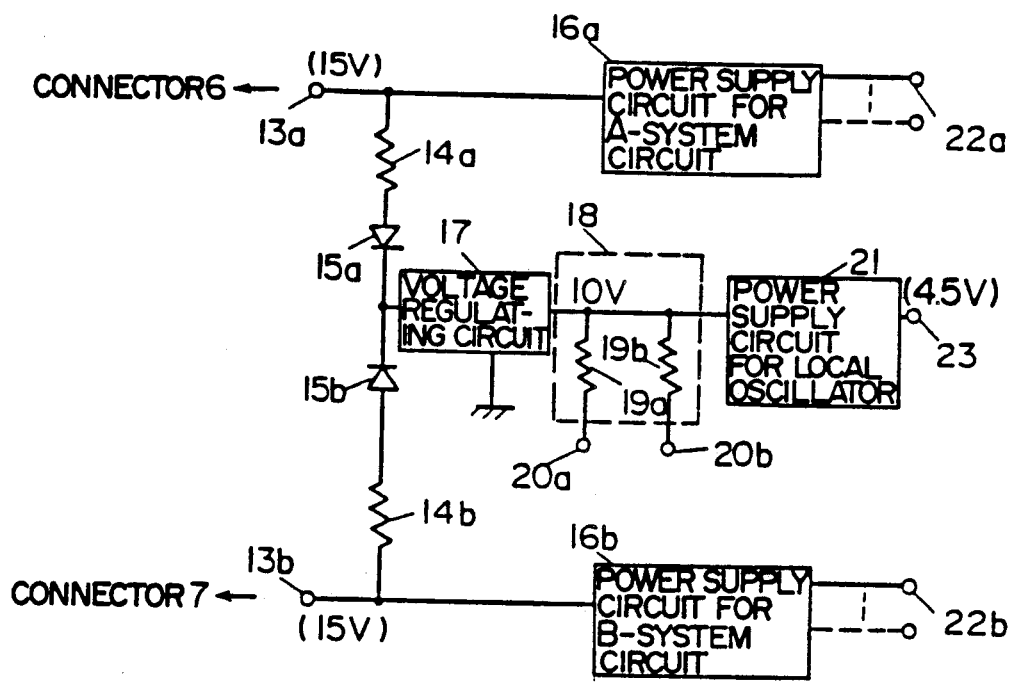
FIG. 3 is a block diagram of the power supply circuit shown in FIG. 2.

Then, the dc power supplied from the indoor unit through the A-system output connector 6 sets the A-system electric signal processing circuit power supply circuit 16a in operation through the terminal 13a of the power supply circuit of FIG. 3 and the dc power is also supplied to the A-system electric signal processing circuit 4 thereby operating the various circuits. Also, simultaneously this power operates the voltage regulating circuit 17 through the resistor 14a and the diode 15a and it also operates the mixer diode biasing power supply circuit 18 and the local oscillator power supply circuit 21, thereby biasing the mixer diodes of the two systems and also operating the local oscillator 8. The dc power from the terminal 13a is not supplied to the B-system electric signal processing circuit power supply circuit 16b due to the presence of the diode 15b.

Then, in FIG. 2 the SHF band signal from the satellite, which has been applied through the input waveguide 2, is separated by the OMT 3 in accordance with the kinds of polarizations of the signal and applied to the A-system electric signal processing circuit 4 and the B-system electric signal processing circuit 5. In this case, the power is not supplied to the B-system electric processing circuit 5 other than the mixer diode of the mixer circuit 11b thereby performing no signal processing and only the signal applied to the A-system electric signal processing circuit 4 becomes effective. Then, the SHF band signal applied to the A-system electric signal processing circuit 4 is amplified by an RF amplifier circuit 10a and subjected to frequency conversion by the mixer circuit 11a, thereby converting it to a UHF band signal. The signal is then amplified by the following IF amplifier circuit 12a and transmitted to the indoor unit from the A-system output connector 6 through the cable.

It is to be noted that as regards a case where only the B-system is operated and the A-system is not operated, only the A-system and the B-system replace each other in the foregoing description and therefore any description of this case will be omitted.

Next, a description will be made of a case where both the A-system and the B-system are operated simultaneously.

In this case, the indoor units are respectively connected to the A-system output connector 6 and the B-system output connector 7 through the cables and power is supplied to both of the connectors. The dc power supplied through the A-system output connector 6 brings the A-system electric signal processing circuit power supply circuit 16a into operation through the terminal 13a of the power supply circuit 9 and it is also supplied to the A-system electric signal processing circuit 4 thereby operating the various circuits. On the other hand, the dc power supplied through the B-system output connector 7 operates the B-system electric signal processing circuit power supply circuit 16b through the terminal 13b of the power supply circuit 9 and it is also supplied to the B-system electric signal processing circuit 5 thereby operating the various circuits.

Then, as regards the supply of power to the voltage regulating circuit 7, the mixer diode biasing power supply circuit 18 and the local oscillator power supply circuit 21, the power is supplied from the terminal 13a side through the resistor 14a and the diode 15a and also the power is supplied from the terminal 13b side through the resistor 14b and the diode 14b of the same resistance value and the diodes 15a and 15b of the same performance are used and that the terminal 13a side is higher in potential than the terminal 13b side, the power supplied from the terminal 13a side is greater than the power supplied from the terminal 13b side. It is needless to say that in any event the mixer diode biasing power supply circuit 18 and the local oscillator power supply circuit 21 are operated through the voltage regulating circuit 17.

Then, in FIG. 2 the SHF band signal from the satellite, which has been applied from the input waveguide 2, is applied to the electric signal processing circuits 4 and 5 of the respective systems through the OMT 3. In this case, the electric signal processing circuits 4 and 5 of the two systems are both supplied with the power and are in operation, so that the applied signal is subjected to signal processing by each of the systems to take the form of a desired signal and the signal is transmitted to the indoor unit through the output connector 6 or 7.

As described hereinabove, the local oscillator 8 which drives the mixer circuits 11a and 11b of the two systems is one and no more and its oscillation output signal is distributed in two and supplied to the mixer circuits 11a and 11b of the two systems. In other words, the oscillation output level is decreased by only an amount corresponding to the distribution so that with a view to making up for this deficiency, the mixer circuits 11a and 11b take the form of circuits which bias their mixer diodes with the dc power so as to cause them to operate on a low local oscillation power. Also, in either of the cases where only one of the systems is operated and where both of the two systems are operated, the mixer diode of each system is always biased. This means that the impedance when looking the mixer circuit side from the local oscillator 8 (the load impedance of the local oscillator) is always constant, that is, the local oscillator always performs a constant operation or putting it in another way the oscillation frequency and the oscillation output level are not varied to allow the local oscillator to always perform a stable operation. Thus, in the low-noise converter incorporating the two systems of the electric signal processing circuits in the same circuit proper, in either of the cases where only one system is operated and where the two systems are operated simultaneously, the stable operation is always effected by the single local oscillator 8.

Note that examples of the voltage values of the power supply circuit of FIG. 3 are stated in the Figure. The voltage applied from the connector 6 or 7 to the terminal 13a or 13b is 15 V, and the power supply circuits 16a and 16b stabilize and drop these voltages to 10 V and other voltages to supply them to the RF amplifier circuits 10a and 10b and the IF amplifier circuits 12a and 12b. The voltage regulating circuit 17 maintains 15 V as a constant voltage and it also drops the 15 V to 10 V and other voltage thereby supplying them to the biasing power supply circuit 18. The local oscillator power supply circuit 21 drops this voltage (10 V) to a voltage of 4.5 V corresponding to the local oscillator 8 to supply it to the latter.

INDUSTRIAL APPLICABILITY

The present invention comprises a frequency converter circuit having a plurality of systems of electric signal processing circuits each including a mixer circuit and the mixer diode of each mixer circuit is always biased with a dc current to always permit a stable operation by a single local oscillator, thereby making it possible to ensure not only an effect from cost point of view but also a reduction in the size and weight of the frequency converter circuit.

Further, while, in a case where a plurality of local oscillators are incorporated in the same circuit proper, the mutual interference and disturbance of the respective local oscillation signals frequently present problems, the frequency converter circuit according to the invention has the single local oscillator and its effect in this respect is great.

I claim:

1. A frequency converter circuit comprising a first electric signal processing circuit having a first single-ended mixer circuit including a single mixer diode, a second electric signal processing circuit having a second single-ended mixer circuit including a single mixer diode, a single local oscillator connected to said first mixer circuit and said second mixer circuit for distributing and supplying a local oscillation signal thereof to said first and second mixer circuits, and a single biasing power supply circuit for supplying a bias current to the mixer diode of each of said first and second mixer circuits.

2. A frequency converter circuit comprising an input waveguide portion for receiving a satellite broadcast signal, separating means for separating an input signal outputted from said input waveguide portion in accordance with kinds of polarizations, a first single-ended mixer circuit including a single mixer diode for receiving a first signal separated and outputted by said separating means, a second single-ended mixer circuit including a single mixer diode for receiving a second signal separated and outputted by said separating means, a single local oscillator connected to said first mixer circuit and said second mixer circuit for distributing and supplying a local oscillation signal thereof to said first and second mixer circuits, and a single biasing power supply circuit for supplying a bias current to the mixer diodes of said first and second mixer circuits.

3. A frequency converter circuit comprising: a first electric signal processing circuit having a first mixer circuit including a mixer diode, a second electric signal processing circuit having a second mixer circuit including a mixer diode, a single local oscillator connected to said first mixer circuit and said second mixer circuit for distributing and supplying a local oscillation signal thereof to said first and second mixer circuits, a biasing power supply circuit for supplying a bias current to the mixer diode of each of said first and second mixer circuits, and first and second diodes whose anodes are respectively connected to an output terminal to which an intermediate frequency signal converted by said first mixer circuit is outputted and an output terminal to which an intermediate frequency signal converted by said second mixer circuit is outputted and whose cathodes are connected to each other to provide a junction point thereof, and wherein said biasing power supply circuit are connected to the junction point of said cathodes of said first and second diodes, whereby a voltage generated from said junction point of said cathodes is maintained as a constant voltage to supply the bias current to said mixer diodes.

4. A frequency converted circuit comprising: a first electric signal processing circuit having a first mixer circuit including a mixer diode, a second electric signal processing circuit having a second mixer circuit including a mixer diode, a single local oscillator connected to said first mixer circuit and said second mixer circuit for distributing and supplying a local oscillation signal thereof to said first and second mixer circuits, a biasing power supply circuit for supplying a bias current to the mixer diode of each of said first and second mixer circuits, and first and second diodes whose anodes are respectively connected to an output terminal to which an intermediate frequency signal converted by said first mixer circuit is outputted and an output terminal to which an intermediate frequency signal converted by said second mixer circuit is outputted and whose cathodes are connected to each other to provide a junction point thereof, a first power supply circuit connected to the junction point of said cathodes of said first and second diodes, whereby a voltage generated from said junction point of said cathodes is maintained at a constant value to produce a constant voltage to supply the bias current to said mixer diodes, and a second power supply circuit for converting said maintained constant voltage to a voltage required for said local oscillator to supply the same to said local oscillator.

5. A frequency converter circuit comprising: an input waveguide portion for receiving a satellite broadcast signal, separating means for separating an input signal outputted from said input waveguide portion in accordance with kinds of polarizations, a first mixer circuit including a mixer diode for receiving a first signal separated and outputted by said separating means, a second mixer circuit including a mixer diode for receiving a second signal separated and outputted by said separating means, a single local oscillator connected to said first mixer circuit and said second mixer circuit for distributing and supplying a local oscillation signal thereof to said first and second mixer circuits, a biasing power supply circuit for supplying a bias current to the mixer diodes of said first and second mixer circuits, and first and second diodes whose anodes are respectively connected to an output terminal to which an intermediate frequency signal converted by said first mixer circuit is outputted and an output terminal to which an intermediate frequency signal converted by said second mixer circuit is outputted and whose cathodes are connected to each other to provide a junction point thereof, and wherein said biasing power supply circuit are connected to the junction point of said cathodes of said first and second diodes, whereby a voltage generated from said junction point of said cathodes is maintained as a constant voltage to supply the bias current to said mixer diodes.

6. A frequency converter circuit comprising: an input waveguide portion for receiving a satellite broadcast signal, separating means for separating an input signal outputted from said input waveguide portion in accordance with kinds of polarizations, a first mixer circuit including a mixer diode for receiving a first signal separated and outputted by said separating means, a second mixer circuit including a mixer diode for receiving a second signal separated and outputted by said separating means, a single local oscillator connected to said first mixer circuit and said second mixer circuit for distributing and supplying a local oscillation signal thereof to said first and second mixer circuits, a biasing power supply circuit for supplying a bias current to the mixer diodes of said first and second mixer circuits, and first and second diodes whose anodes are respectively connected to an output terminal to which an intermediate frequency signal converted by said first mixer circuit is outputted and an output terminal to which an intermediate frequency signal converted by said second mixer circuit is outputted and whose cathodes are connected to each other to provide a junction point thereof, a first power supply circuit connected to the junction point of said cathodes of said first and second diodes, whereby a voltage generated from said junction point of said cathodes is maintained at a constant value to produce a constant voltage to supply the bias current to said mixer diodes, and a second power supply circuit for converting said maintained constant voltage to a voltage required for said local oscillator to supply the same to said local oscillator.

* * * * *